(12) United States Patent
Kautzsch et al.

(10) Patent No.: US 8,921,974 B2
(45) Date of Patent: Dec. 30, 2014

(54) SEMICONDUCTOR MANUFACTURING AND SEMICONDUCTOR DEVICE WITH SEMICONDUCTOR STRUCTURE

(71) Applicant: Infineon Technologies AG, Neubiberg (DE)

(72) Inventors: Thoralf Kautzsch, Dresden (DE); Boris Binder, Dresden (DE); Uwe Rudolph, Dresden (DE); Frank Hoffman, Freiberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/911,106

(22) Filed: Jun. 6, 2013

(65) Prior Publication Data

US 2013/0328143 A1    Dec. 12, 2013

Related U.S. Application Data

(63) Continuation of application No. 12/885,336, filed on Sep. 17, 2010, now Pat. No. 8,481,400.

(51) Int. Cl.
*H01L 29/00* (2006.01)
*H01L 21/76* (2006.01)
*B81C 1/00* (2006.01)
*B81B 3/00* (2006.01)

(52) U.S. Cl.
CPC ......... *B81C 1/00626* (2013.01); *B81C 1/00182* (2013.01); *B81B 2203/0315* (2013.01); *B81C 2201/0116* (2013.01); *B81B 3/0021* (2013.01); *B81B 2203/0109* (2013.01)
USPC ............ 257/522; 438/411; 438/415; 438/422

(58) Field of Classification Search
USPC .................... 257/48, 414–418, 522, E23.013, 257/E21.564, E33.069, E23.128; 438/48, 438/50–53, 422
See application file for complete search history.

(56) References Cited

U.S. PATENT DOCUMENTS 7,354,786 B2 *   4/2008   Benzel et al. .................... 438/50
7,436,573 B2 *  10/2008   Doan et al. ..................... 359/291

* cited by examiner

*Primary Examiner* — Hsien Ming Lee
(74) *Attorney, Agent, or Firm* — SpryIP, LLC

(57) ABSTRACT

Embodiments related to semiconductor manufacturing and semiconductor devices with semiconductor structure are described and depicted.

15 Claims, 10 Drawing Sheets

US 8,921,974 B2

SEMICONDUCTOR MANUFACTURING AND SEMICONDUCTOR DEVICE WITH SEMICONDUCTOR STRUCTURE

REFERENCE TO RELATED APPLICATIONS

This application is a continuation of U.S. patent application Ser. No. 12/885,336 which was filed on Sep. 17, 2010 and claims the benefit of the priority date of the above U.S. patent application, the contents of which are herein incorporated in its full entirety by reference.

BACKGROUND

Semiconductor devices are used today in ever-increasing numbers in the daily life. Typically, such semiconductor devices are manufactured by many steps in the manufacturing process including structuring masks, depositing semiconductor or non-semiconductor layers, etching these layers etc.

For example in the field of integrated acceleration sensor devices, in order to obtain movable elements, a sequence of process steps is typically applied which includes the deposition and structuring of an oxide layer on top of a silicon substrate. On top of the structured oxide layer, a Poly-Si (Poly-silicon) layer is deposited. After structuring the Poly-Si layer, the oxide layer acting as sacrificial layer is etched by a wet chemical etching step.

SUMMARY

In one aspect, a method comprises the removal of semiconductor material in at least first and second portions of a semiconductor substrate such that a semiconductor structure in the semiconductor substrate is formed between the removed first and second portions. A migration process is applied to the semiconductor substrate such that a first part of the semiconductor structure remains after the migration process and semiconductor material of a second part of the semiconductor structure migrates to other locations. A continuous space being free of semiconductor material and extending above the remaining first part of the structure and a continuous semiconductor material layer extending above the continuous space from the first to the second portions is formed by the migration of the material of the second part of the semiconductor structure.

In a further aspect, a method of fabricating a device comprises the removal of bulk material in a semiconductor substrate such that a semiconductor structure extending into the substrate is formed by the removal of bulk material. A protection layer is formed on a wall of the semiconductor structure such that a first part of the semiconductor structure is covered by the protection layer and a second part of the semiconductor structure is not covered by the protection layer. The semiconductor substrate is then processed such that the first part of the semiconductor structure remains and the second part of the semiconductor structure is removed after the processing, wherein after the processing a space free of semiconductor material which continuously extends in the substrate above the second part of the semiconductor structure is formed.

In a further aspect, a device comprises a semiconductor substrate of bulk material having a flexible element, the flexible element being formed from bulk material of the semiconductor substrate. The device further has a layer with bulk material and a continuous material-free space extending between the substrate and the layer with bulk material.

DETAILED DESCRIPTION

Figure 1A:
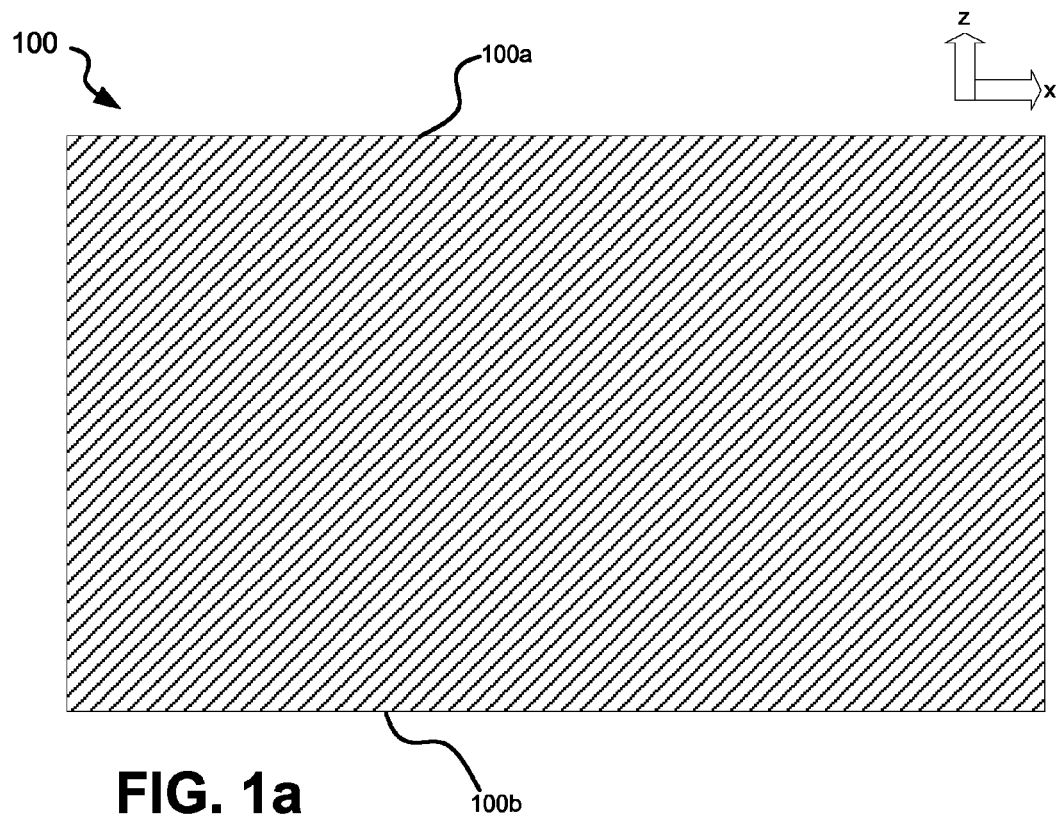
FIGS. 1a-1d show schematic cross-sectional views according to an embodiment.

The following detailed description explains exemplary embodiments. The description is not to be taken in a limiting sense, but is made only for the purpose of illustrating the general principles of embodiments while the scope of protection is only determined by the appended claims.

In the exemplary embodiments shown in the drawings and described below, any direct connection or coupling between functional blocks, devices, components or other physical or functional units shown in the drawings or described herein may also be implemented by an indirect connection or coupling unless specifically noted otherwise.

In the described embodiments, specific views or schematic views of devices, elements etc. such as cross-sectional views, top views, bottom views, three-dimensional views etc. are shown in one or more of the figures in order to allow a better understanding of these embodiments. It is however to be noted that these views may not be drawn to scale. Furthermore, these views may not be drawn in a proportional manner to allow a better understanding of these embodiments. It is therefore to be understood that dimensions of certain elements, parts or portions of elements etc. may be provided in the figures larger or smaller in relation to other elements or parts of elements.

Further, it is to be understood that the features of the various exemplary embodiments described herein may be combined with each other, unless specifically noted otherwise.

In the various figures, identical or similar entities, modules, devices etc. may have assigned the same reference number.

Referring now to FIGS. 1a to 1d, an embodiment of a manufacturing process of a micro-mechanical device according to an embodiment is shown.

FIG. 1a shows a cross-sectional view of a substrate 100 into which a structured element is to be formed as described below. The substrate 100 has a first main surface 100a and a second main surface 100b. The substrate comprises bulk semiconductor material such as bulk Si, bulk Ge, etc. The substrate 100 may be a mono-crystalline wafer or part of a mono-crystalline wafer formed by breaking or slicing a wafer into smaller pieces. In some embodiments, the semiconductor substrate 100 may have one or more layers overlaying the bulk material. In FIG. 1a and the following figures, spatial directions and spatial axes are shown. A direction or axis which is perpendicular to the main surfaces 100a and 100b is shown in FIG. 1a as a z-axis and may be also referred in the following as vertical direction or vertical axis. FIG. 1a further shows the x-axis as one of the two axes with direction parallel to the main surfaces which are referred to in the following also as horizontal directions. It is to be understood that the concept of vertical and horizontal is used herein to refer to orientations with respect to the main surfaces 100a and 100b of the substrate.

Figure 1B:
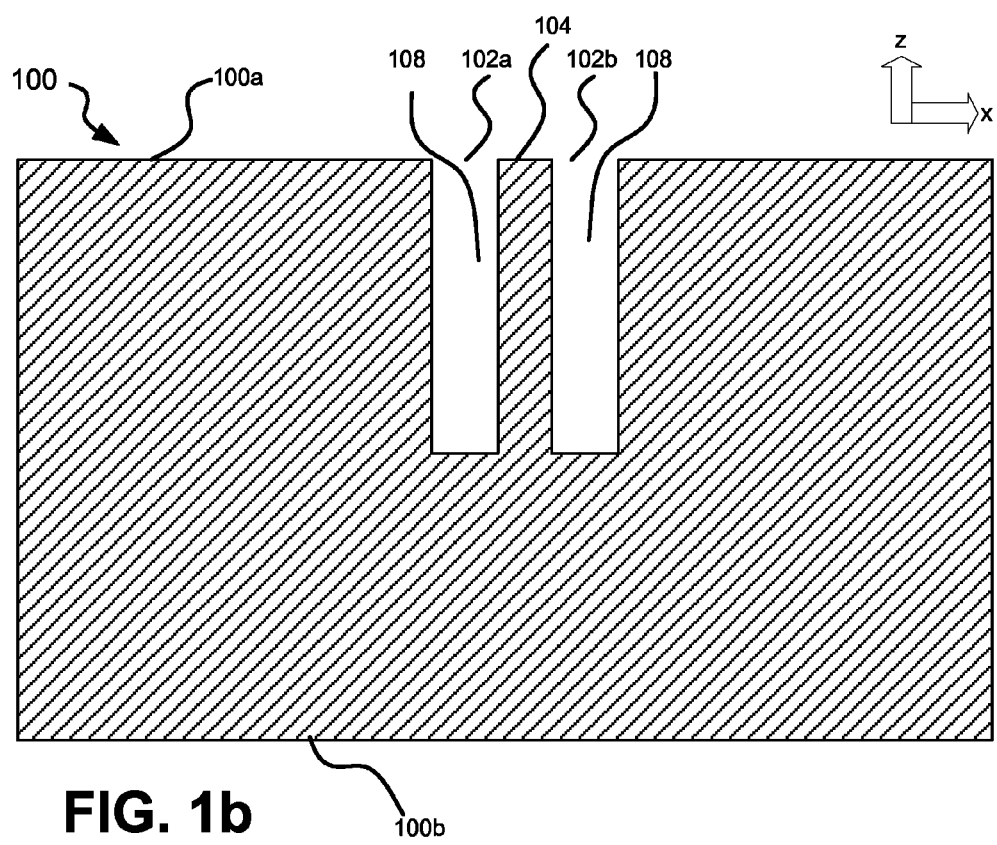

Referring now to FIG. 1b, openings 108 are formed in the substrate 100 by removing the mono-crystalline bulk material in a first portion 102a and a second portion 102b of the semiconductor substrate 100. The openings 108 may for example be formed by depositing and structuring a hard mask and etching through the hard mask to remove the bulk material of the substrate. The openings 102a and 102b may be separated from each other or may be connected at other locations to each other, i.e. may be part of a same overall opening or channel structure.

The openings 108 may for example include trenches such as deep trenches or other opening shapes extending in the vertical direction (z-direction) within the substrate. In embodiments, the openings may be elongate in the vertical direction such that the widths in a horizontal direction (x-direction) are smaller or much smaller than the depth in vertical direction. In some embodiments, the openings may have in the vertical direction a depth in the range between 2 micrometers (2 μm) and 200 micrometers (200 μm). In some embodiments the width in the x-direction of the opening portions 102 may each be within the range of 10 nm to 2 micrometers (2 μm). The aspect ratio of each of the opening portions 102 may be chosen in some embodiments to be in the range between 1 and 10000, in some embodiments, the aspect ration may be chosen to be within a range of 10 to 1000.

A structure 104 is formed between the openings 108 by the bulk material of the substrate 100. The structure 104 may for example have a lamella shape, a disk shape or other shapes. The structure may extend in the horizontal direction as will be described in more detail below. The structure 104 may in some embodiments have a width in the horizontal direction selected within a range of 50 nm to 5000 nm. It is to be understood that FIG. 1b only shows a cross-section of the structure 104. In some embodiments the structure formed by the openings 108 may extend in y-direction such that the width of the structure 104 in x-direction varies along the y-axis. The depth of the structure 104 in z-direction corresponds to the depth of the opening portions 102. In some embodiments, the remaining part of the structure 104 may form a mechanical flexible part of a MEMS device as will described below.

The opening 108 and the structure 104 further extend in the y-direction within the substrate 100 which is not shown in FIG. 1b. In some embodiments, the remaining part of the structure 104 after the processing will form a flexible element of a MEMS device for example a flexible element of a sensor such as a force sensor, pressure sensor or acceleration sensor. Such flexible elements which are capable of moving relative to the substrate 100 are used for example in operation of sensors or other devices to detect a force, acceleration or a pressure depending on the deflection of the flexible element relative to the substrate 100. Examples of flexible elements include but are not limited to comb-like electrodes arranged interdigital with fixed electrodes for forming an accelerator sensor or a membrane which is capable of bending in view of a change of a pressure etc.

Figure 1C:
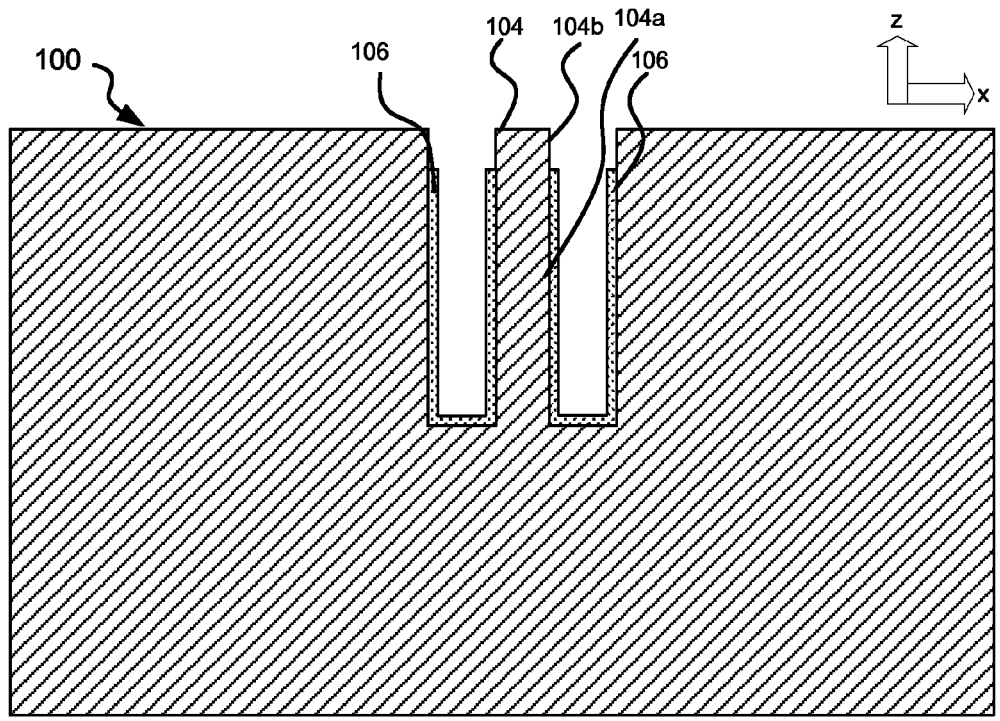

Referring now to FIG. 1c, a liner or protection layer 106 is formed such that a first portion or part 104a of the structure 104 is covered by the protection layer 106. A second portion or part 104b of the structure 104 is not covered by the protection layer 106. In FIG. 1c, the protection layer 106 is therefore only formed on a first portion of the wall of structure 104 while the protection layer 106 is not formed on at least a second portion of the wall of the structure 104. In some embodiments, the second part is above the first part with reference to the z-direction. In some embodiments, as will be described below, in addition to the second part 104b, one or more other parts of the structure 104 may not be covered by the protection layer 106. The protection layer 106 defines for a subsequent migration process the part or parts of the structure 104 which are not affected by material migration, i.e. which remain after the migration process and further defines the part or parts of the structure 104 which are affected by migration i.e. in which the material migrates to form at a different location within the substrate a layer of recrystallized mono-crystalline bulk material which will be described below.

The protection layer 106 has a material different from the bulk semiconductor material. In embodiments, the material of the protection layer 106 may include an oxide such as silicon dioxide or aluminum oxide (alumina), a nitride such as silicon nitride, high-K materials and other materials. The protection layer 106 may in some embodiments have a thickness of only a few nanometers. In some embodiments, the thickness of the protection layer 106 may depend on the width of the openings 108 to be for example in the range of ⅛ to ¹⁄₂₀ of the width of the openings.

The migration process includes in embodiments a heat treatment in a hydrogen atmosphere which is applied for some time to remove the second part 104b of the structure 104. The material of the second part 104b migrates to form a continuous bulk layer in the semiconductor substrate 100 above the remaining first part 104a of the structure 104. The migration process may be a process in which the removed material is recrystallized after migration by a self-organization such as a migration process known as the Venezia process. By heating the substrate to temperatures between 1000 and 1200° C. and providing a hydrogen atmosphere with a partial pressure in the range between 10 and 10000 Pa, a H-bake process is provided in which the bulk semiconductor material can be converted in a gas phase. For example, in the case of silicon as bulk material, the Si atoms are by the heat treatment in hydrogen atmosphere converted to Silane gas. The Si atoms are then recrystallized from the Silane gas to form a continuous layer of crystalline material as will be described below.

The material and thickness of the protection layer 106 may be selected depending on the specific implementation such as the dimensions of the openings 108 and the structure 104, etching processes and mask layers used during processing or other layers provided during the manufacturing process. The protection layer 106 may in some embodiments include more than one layer, for example two or more selective etchable layers. The protection layer 106 may first be deposited along the sidewalls to cover the whole structure 104 and then structured or etched back in order to remove the protection layer 106 in the second part of the structure 104. An exemplary embodiment to obtain the protection layer 106 structured such that the second part 104b of the structure 104 is not covered by the protection layer 106 will be described below with respect to FIGS. 3a-3h.

Figure 1D:
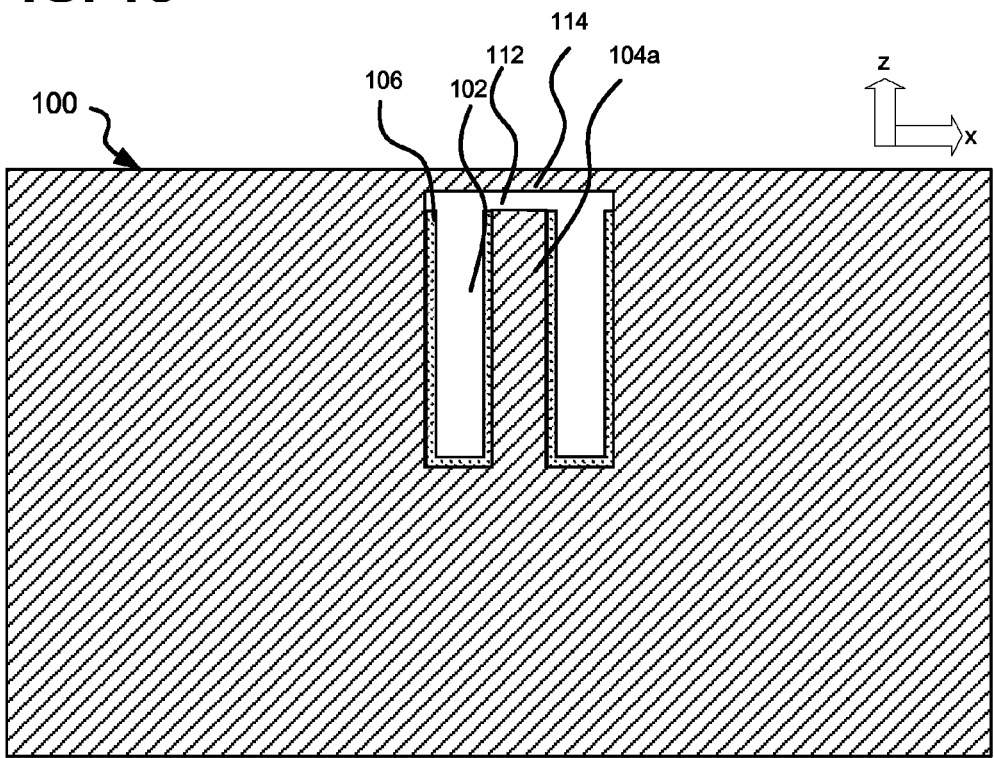

Referring now to FIG. 1d, as a result of the migration process, a continuous space or gap 112 free of semiconductor material is formed. Furthermore, concurrently with the space 112, a continuous layer 114 of recrystallized bulk material is formed during the migration process. The continuous layer 114 has in embodiments no openings or holes and is therefore capable of providing an upper seal or cover for the remaining part 104a. The continuous layer 114 continuously extends above the remaining part 104a of the semiconductor structure 104. The space 112 and the continuous layer 114 extend parallel to each other in horizontal directions from the first portion 102a and over the openings 108 to the second portion 102b. By having the layer 114 formed during the migration process, the migration process described above allows obtaining a seal or cover of crystalline material for the device with a distance defined by the space 112 between the seal or cover and the remaining part 104a of the structure 104. It is to be appreciated that the remaining part 104a is separated from the cover and therefore made movable. The process described above allows obtaining devices with movable elements in a very cost-effective manner by avoiding the many deposition, etching and structuring steps which are required in known manufacturing processes. Furthermore, the above process is capable to provide smaller flexible or movable elements compared to known manufacturing processes. Furthermore, it is appreciated by a person skilled in the art that the flexible element is formed within the bulk substrate and not in a separate layer on top of the bulk substrate. The small size of the flexible element being at the level of the bulk substrate allows easy integration within the substrate and the manufacturing process can easily be integrated in existing CMOS processes and CMOS circuit elements may be formed in subsequent processing steps.

In embodiments, the remaining part 104a is forming a mechanical flexible element for sensor devices or MEMS (Micro Electric Mechanical System) devices. The protection layer 106 may remain on the part 104a or may be subsequently removed. With the process described above, devices such as MEMS devices or sensor devices having one or more flexible elements of bulk semiconductor material can be manufactured in a very efficient and cost-effective manner since both the space 112 and the continuous layer 114 are formed within one process step. While known manufacturing processes need many photolithography and etch steps to obtain the flexible element with a cap and a space between the cap, the process described above allows efficient processing and efficient forming of these elements. Furthermore, the process described above forms the flexible element from bulk material which is in many applications advantageous over polycrystalline or other material. Furthermore, it will be appreciated by the person skilled in the art that in addition to the flexible element also the continuous layer is formed of crystalline material by recrystallization of the migrated material.

The substrate may in some embodiments further be thinned in a subsequent process step to obtain a thickness of the substrate in the range between 150 and 350 µm.

The process described above therefore allows for example the manufacturing of cost-reduced ASIC devices having movable elements integrated. The movable elements may be provided and used for applications which include but are not limited to acceleration sensor applications, movement detection sensor applications, tire pressure sensor applications etc.

Figure 5:
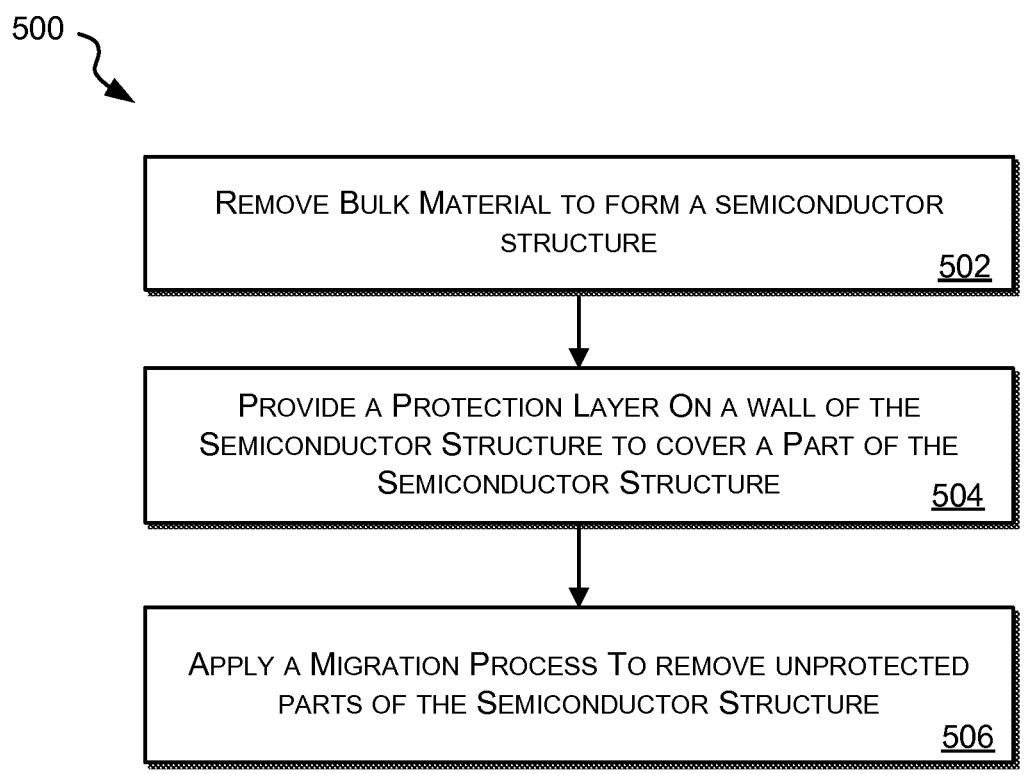
FIG. 5 shows a flow chart diagram according to an embodiment.

An exemplary process flow diagram according to an embodiment is shown in FIG. 5. The process flow starts at 502 with the removal of bulk semiconductor material to form a semiconductor structure in a substrate.

Then at 504, a protection layer is formed on a wall of the semiconductor structure.

In step 506, the migration process is applied to remove the unprotected parts of the semiconductor structure i.e. the parts with corresponding walls which are not covered by the protection layer.

In some embodiments, electrical isolation for the remaining part 104a is provided against the substrate 100. Such isolation may for example be needed in order to allow capacitive measurements or other electric measurements of the deflection of the flexible element. Electrical isolation may for example be achieved by forming appropriate p-n junctions or isolation sections in parts of the structure 104 or the substrate 100. It is further to be noted that the embodiment shown in FIGS. 1a-1d may be implemented in various ways and may have additional process steps not shown. For example, various layers other than the layers described may be formed during particular steps. Such layers may remain or may be removed during or after the manufacturing process. Furthermore, it is to be noted that various etching and lithography steps may be applied during the manufacturing process.

Figure 2A:
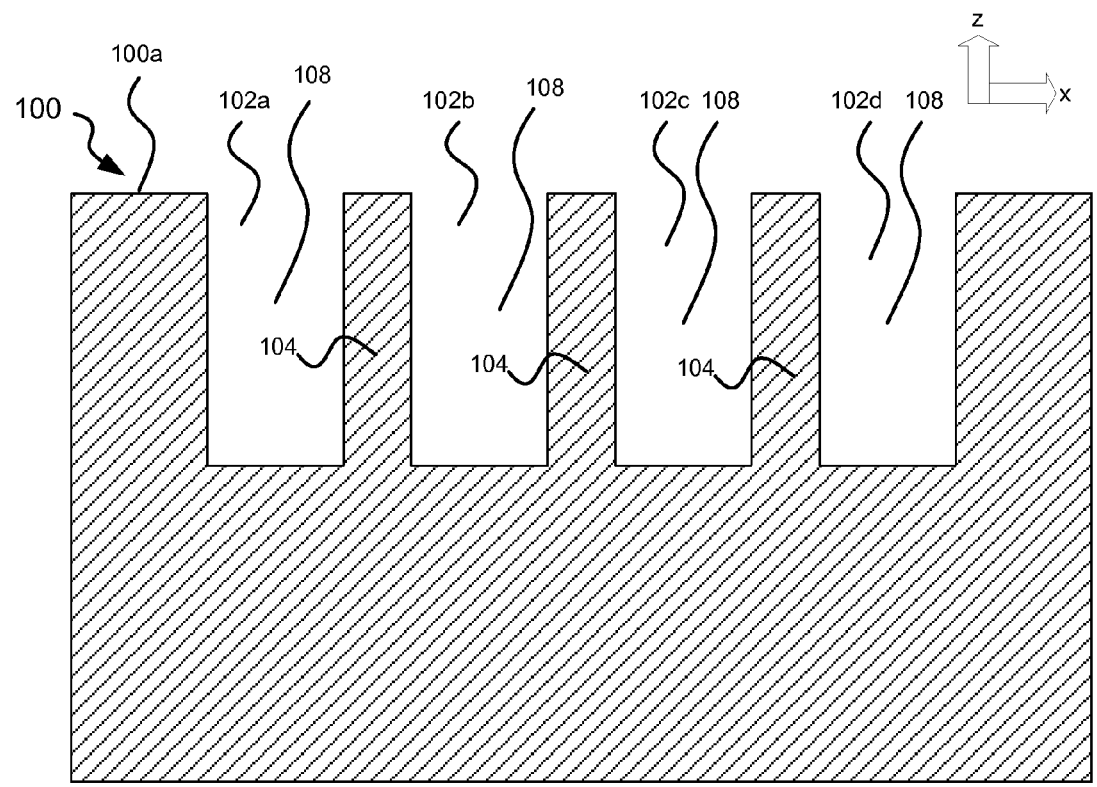
FIGS. 2a-2c show schematic cross-sectional views according to an embodiment.
Figure 2B:
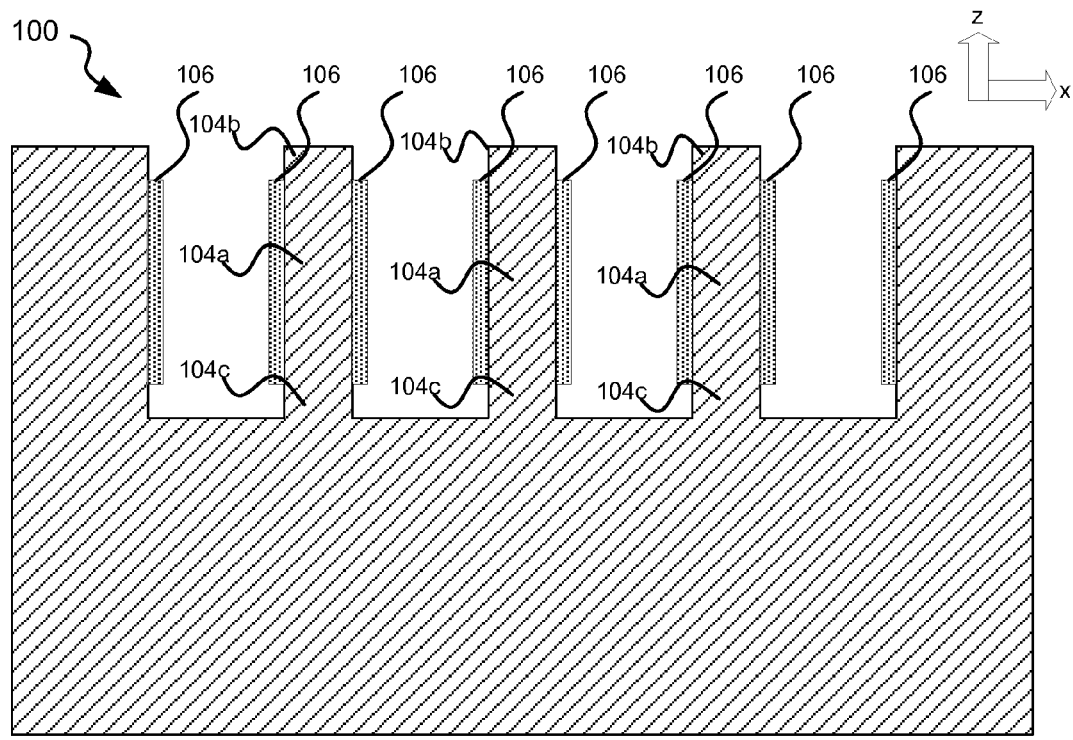
Figure 2C:
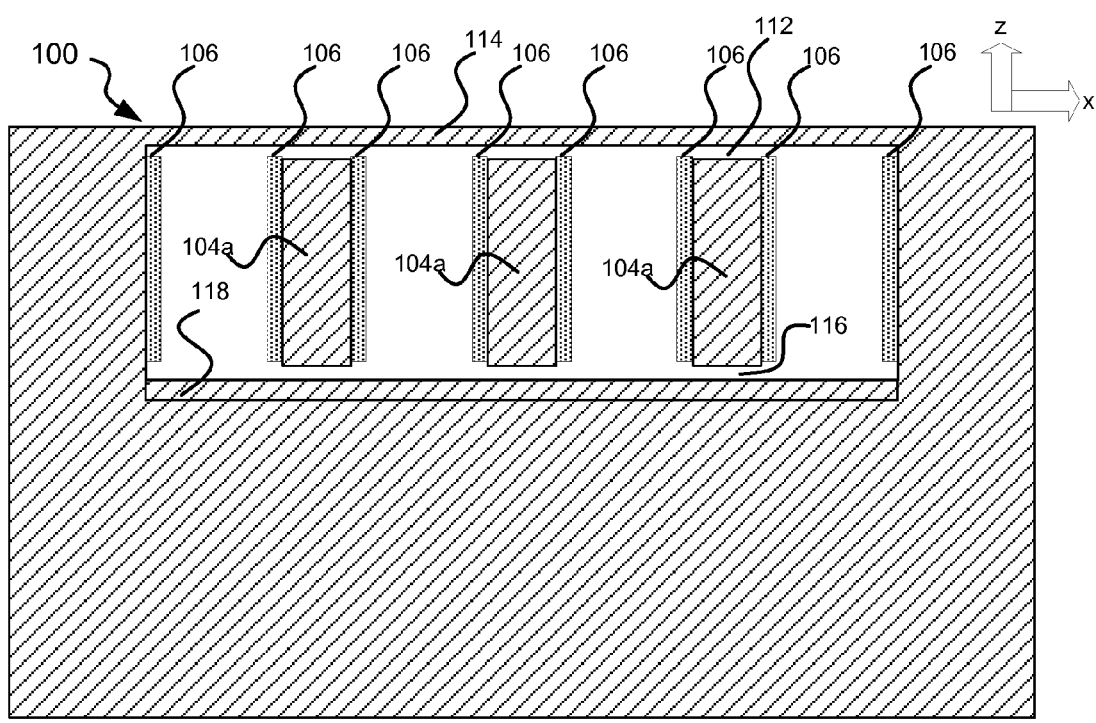

Referring now to FIG. 2a to 2c, an embodiment is described in which in addition to the second part 104b at the top of the structure 104 a further part 104c at the bottom of the structure 104 is uncovered by the protection layer 106. While FIGS. 1a-d show a process in which the structure 104 is formed by openings in two portions 102a and 102b, FIGS. 2a to 2c show an embodiment with a multiplicity of openings 108 formed in multiple portions. However, it is to be noted that the embodiment shown in FIGS. 1a to 1d as well as the embodiment shown in FIGS. 2a to 2c can be implemented with any number of openings.

Referring now to FIG. 2a, a plurality of openings 108 are formed in portions 102a, 102b, 102c and 102d to obtain the semiconductor structure 104 of bulk material. The forming of the openings 108 has already been described with respect to FIGS. 1a and 1b and reference is made thereto.

Then, as shown in FIG. 2b, the protection layer 106 is formed. Distinguished from the forming of the protection layer 106 in FIG. 1b, the protection layer 106 according to FIG. 2b is formed such that in addition to the second part 104b a third part 104c of the semiconductor structure 104 is not covered by the protection layer 106. As can be seen, in the embodiment shown in FIG. 2b, the second part 104b is with respect to the vertical direction the uppermost or top part and the third part 104c is the lowermost or bottom part of the semiconductor structure 104. The part 104a covered by the protection layer 106 is therefore between the two parts 104b and 104c.

After applying the migration process, in view of the parts 104b and 104c uncovered by the protection layer 106, the bulk material of these parts is subjected to migration. As described earlier, during the migration process, a heat treatment in hydrogen atmosphere is applied causing the bulk material of parts 104b and 104c to be converted into gas phase, for example silane gas, and to be recrystallized in a self-organized manner to form continuous layers 114 and 118 of crystalline material with spaces 112 and 116 between the remaining part 104a of the semiconductor structure 104 and the respective continuous crystalline layers 114 and 118. As is apparent from FIG. 2c, the continuous layers 114 and 118 and the spaces 112 and 116 each extend in horizontal direction over all openings 108. Spaces 112 and 116 are formed opposing each other with the remaining part 104a of the semiconductor structure in between. Continuous layers 114 and 118 are formed opposing each other with the remaining part 104a of the semiconductor structure and the spaces 112 and 116 in between. It is to be noted that with the applying of the migration process described above to the semiconductor structure 104 having a part covered and two or more parts uncovered by the protection layer 106, the continuous layer 114 providing a cover for the flexible element of the device is formed together with spaces 112 and 116 which decouple the remaining part 104a of the structure 104 in the areas covered by the openings 108 from the substrate and the cap within a single process step of the manufacturing process. In other words, since spaces 112 and 116 are formed simultaneously above the top and below the bottom of the remaining part 104a, the top and bottom of the remaining part 104 both get separated from the substrate and an element with bulk material capable of performing deflections in horizontal direction relative to the substrate is formed. However, since all the elements mentioned above are formed within a single process step by a self-organized migration, the process is in addition to the easy integration also much more efficient and cost-effective than an existing process for forming such MEMS elements.

Turning now to FIGS. 3a to 3h, an exemplary embodiment of a process will be described in more detail in which the protection layer 106 is formed such that an uppermost part 104b and a lowermost part 104c of the semiconductor structure 104 is uncovered and removed during the migration process. In the process described with respect to FIGS. 3a to 3h, the structure is formed by two etching steps. It is to be understood however that other embodiments may encompass a single etching step or more than two etching steps for providing and structuring the protection layer such that the uppermost part and lowermost part of the semiconductor structure 104 uncovered by protection layer 106.

Figure 3A:
FIGS. 3a-3h show schematic cross-sectional views according to an embodiment.
Figure 3B:
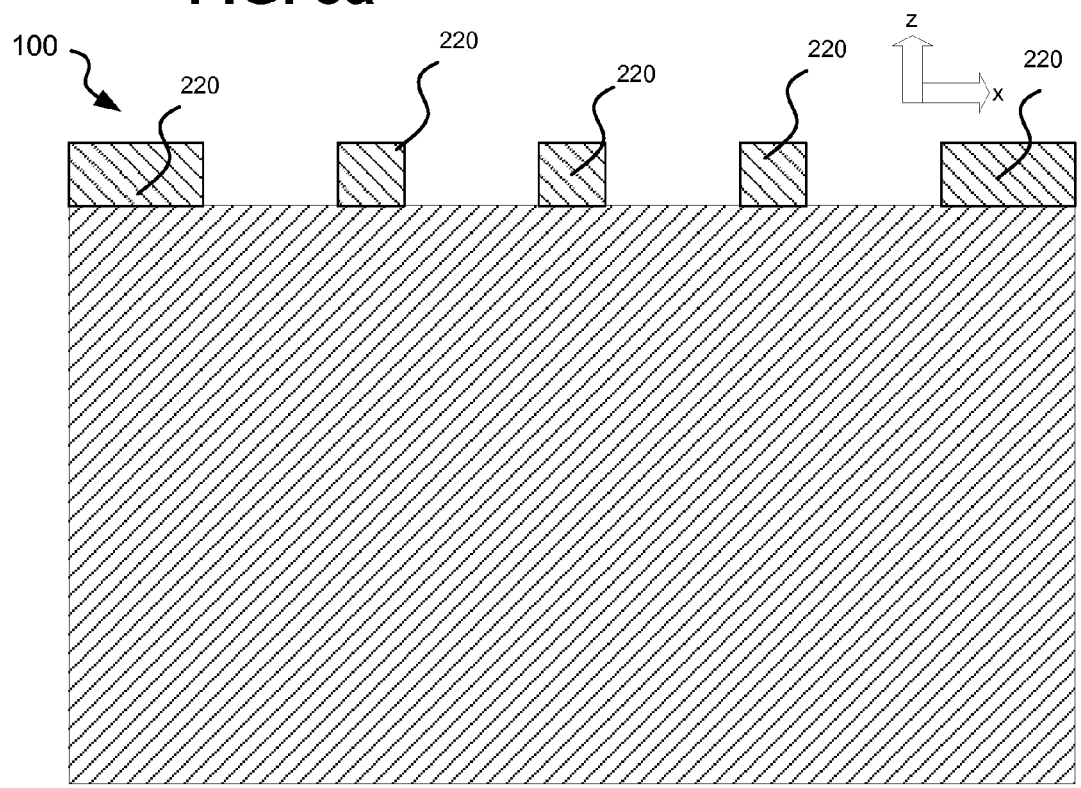
Figure 3C:
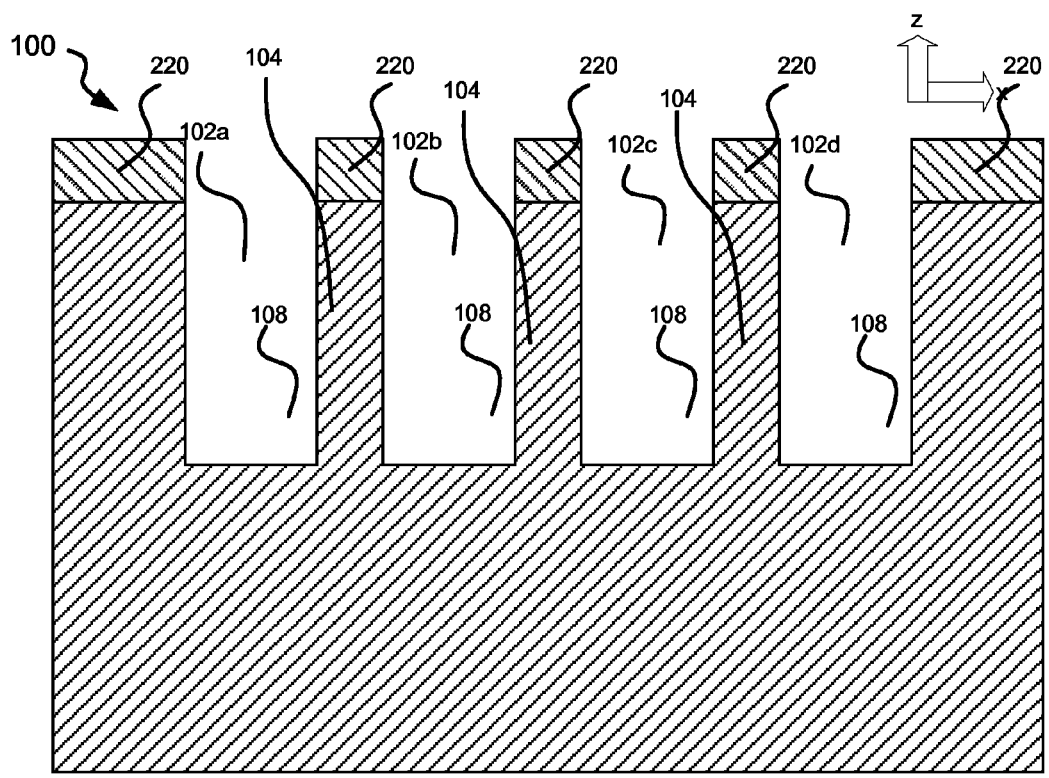

The process starts with the applying and structuring of a mask 220 on the semiconductor substrate 100 shown in FIG. 3a. The mask may be a hard-mask formed by one or more layers of nitride and/or oxide material and/or poly-Si. FIG. 3b shows the semiconductor substrate 100 after forming the mask 220. The mask 220 defines the portions of the semiconductor substrate 100 in which material is removed in a subsequent etching step to form the semiconductor structure. FIG. 3c shows the semiconductor substrate 100 after the semiconductor bulk material is removed in the portions 102a-102d of the semiconductor defined by the mask 220. Thereafter, a first etching is applied to remove bulk material of the substrate 100 thereby forming the openings 108 and the structure 104 in the substrate 100.

Figure 3D:
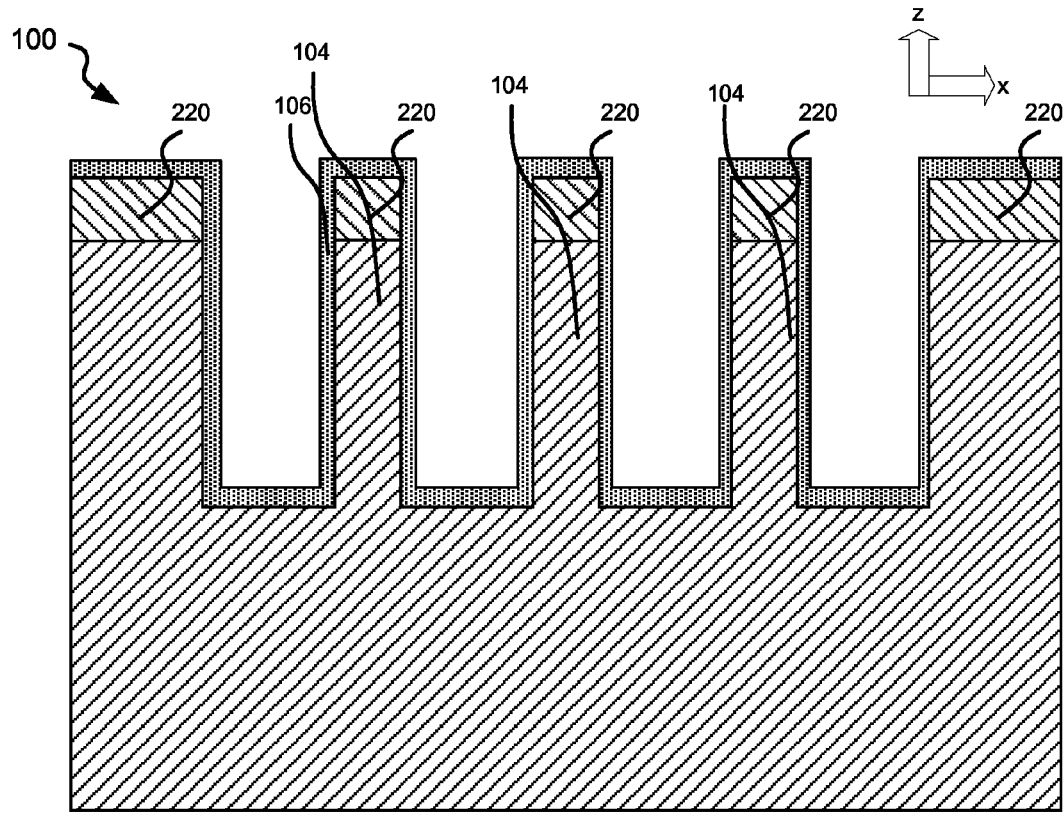
Figure 3E:
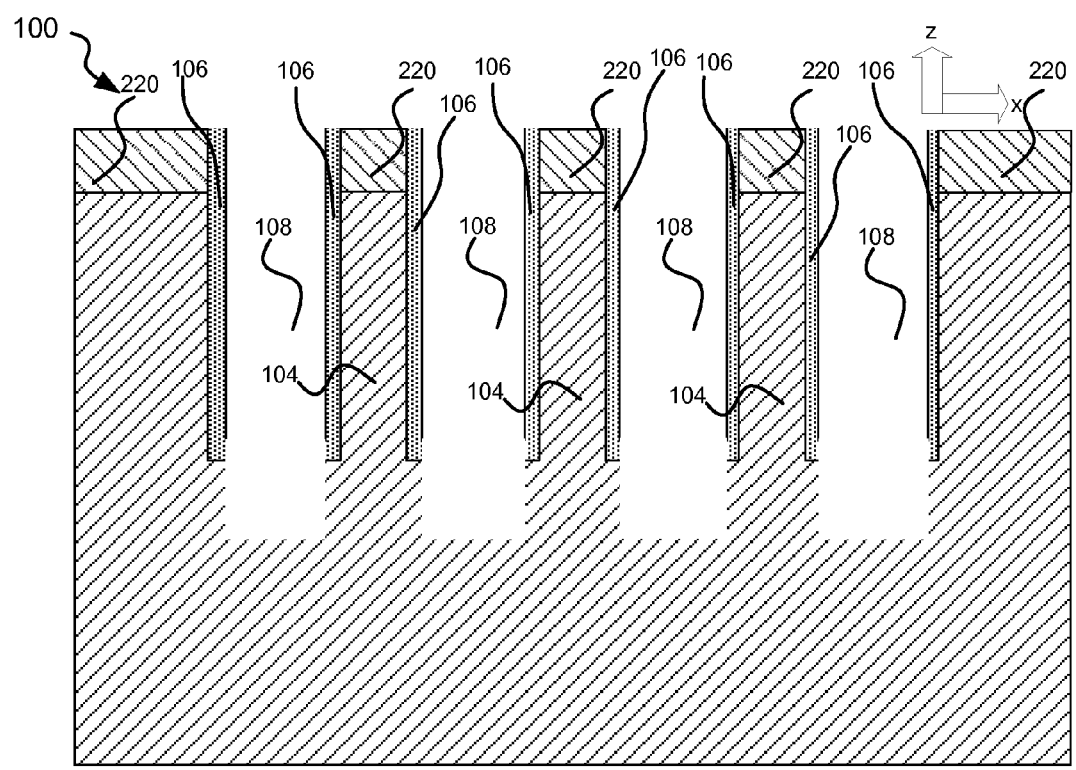
Figure 3F:
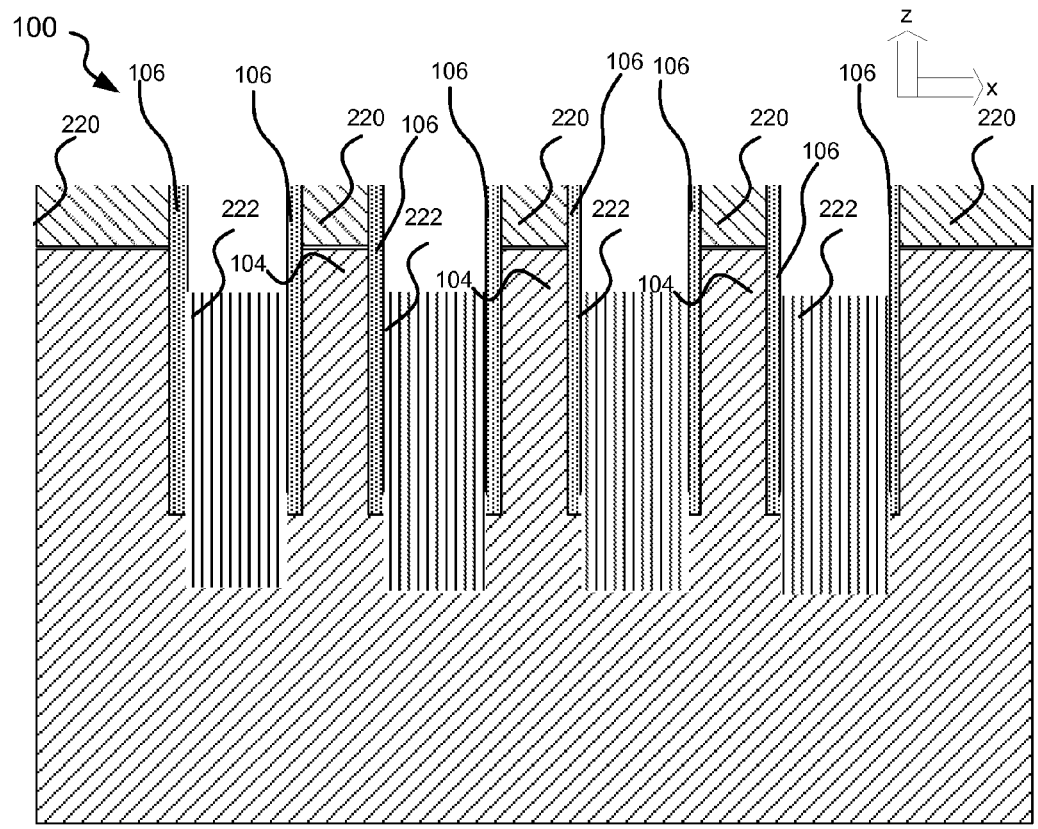

Referring now to FIG. 3d, the protection layer 106 is deposited on the entire surfaces of the openings 108. After the protection layer 106 is deposited, the openings 108 are opened at the bottom by the removal of the protection layer 106 locally at the bottom and further bulk material of the substrate is removed. The removal of the further material of the substrate 100 thereby extends the openings 108 in the vertical direction further into the substrate 100.

Subsequently, the openings 108 are filled with a filler 222. The filler 222 is provided in vertical direction only up to a certain fraction of the openings 108. This may be achieved by completely filling the openings 108 with the filler material and then removing the filler material until it extends only up to the fraction of the openings 108. The filler material may for example include a photo resist which can be stripped in a definite manner for example by plasma etching. After the filler material is reduced, the protection layer 106 on the surface of the openings not covered by the filler 222 is etched and removed thereby.

Figure 3G:
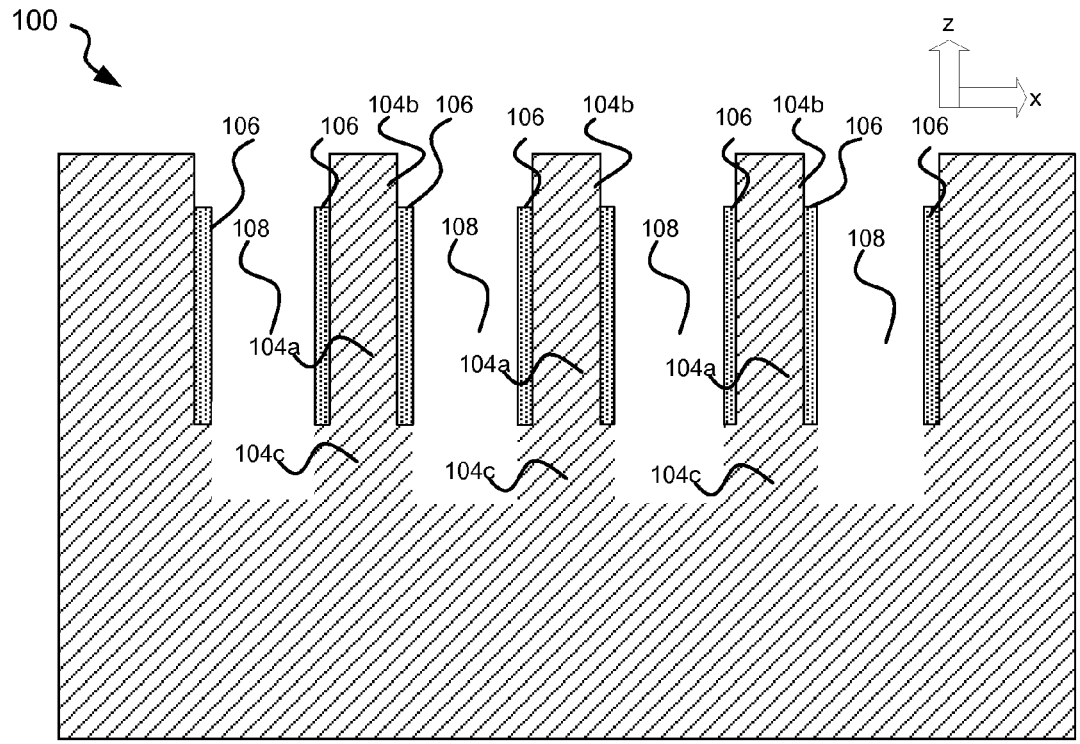
Figure 3H:
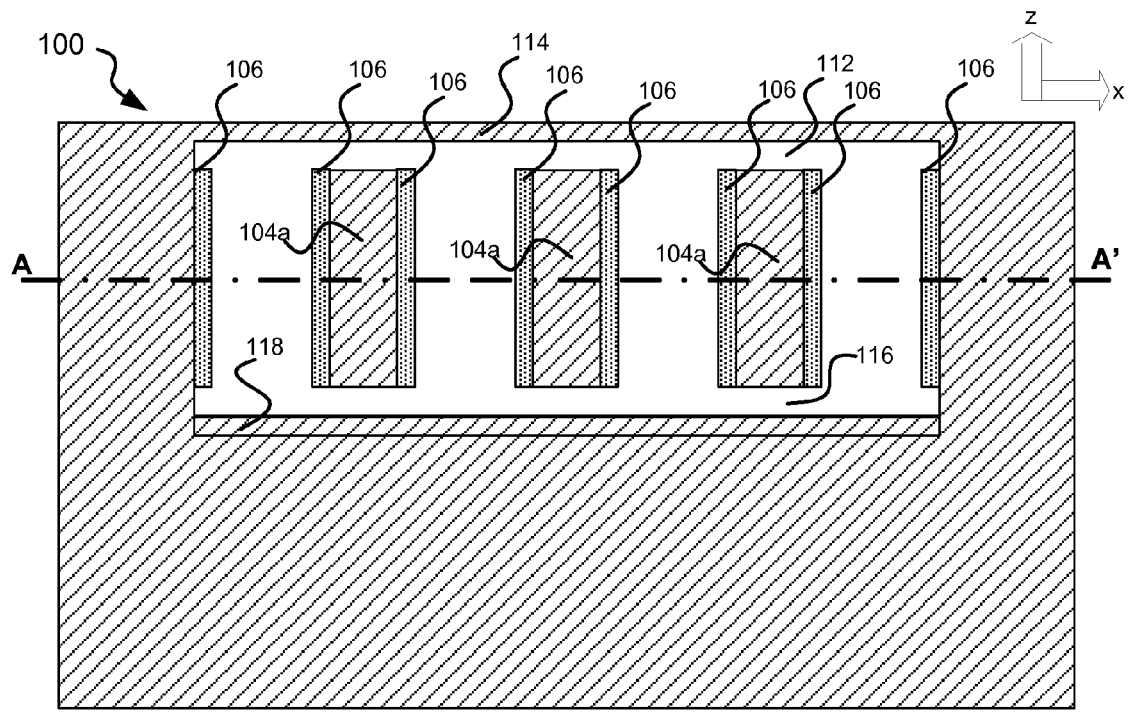

After the removal of the protection layer 106 in the regions uncovered by the filler 222, the filler 222 is completely removed from the openings 108 as shown in FIG. 3g. The protection layer 106 extends now only along the middle part 104a of the structure 104 while the uppermost part 104b and the lowermost part 104c are not covered by the protection layer 106. It is to be noted here that FIG. 3g essentially corresponds to FIG. 2b.

Then, as described with respect to FIG. 2c, the parts 104b and 104c are removed in the migration process and the continuous spaces 112 and 116 and the continuous layers 114 and 118 extending over all openings 108 are formed by the migrated bulk material in the migration process. As noted above, the material of layers 114 and 118 is the bulk semiconductor material migrated from parts 104b and 104c and layers 114 and 118 are crystalline layers because of the migrated material recrystallized during the migration process.

Figure 4:
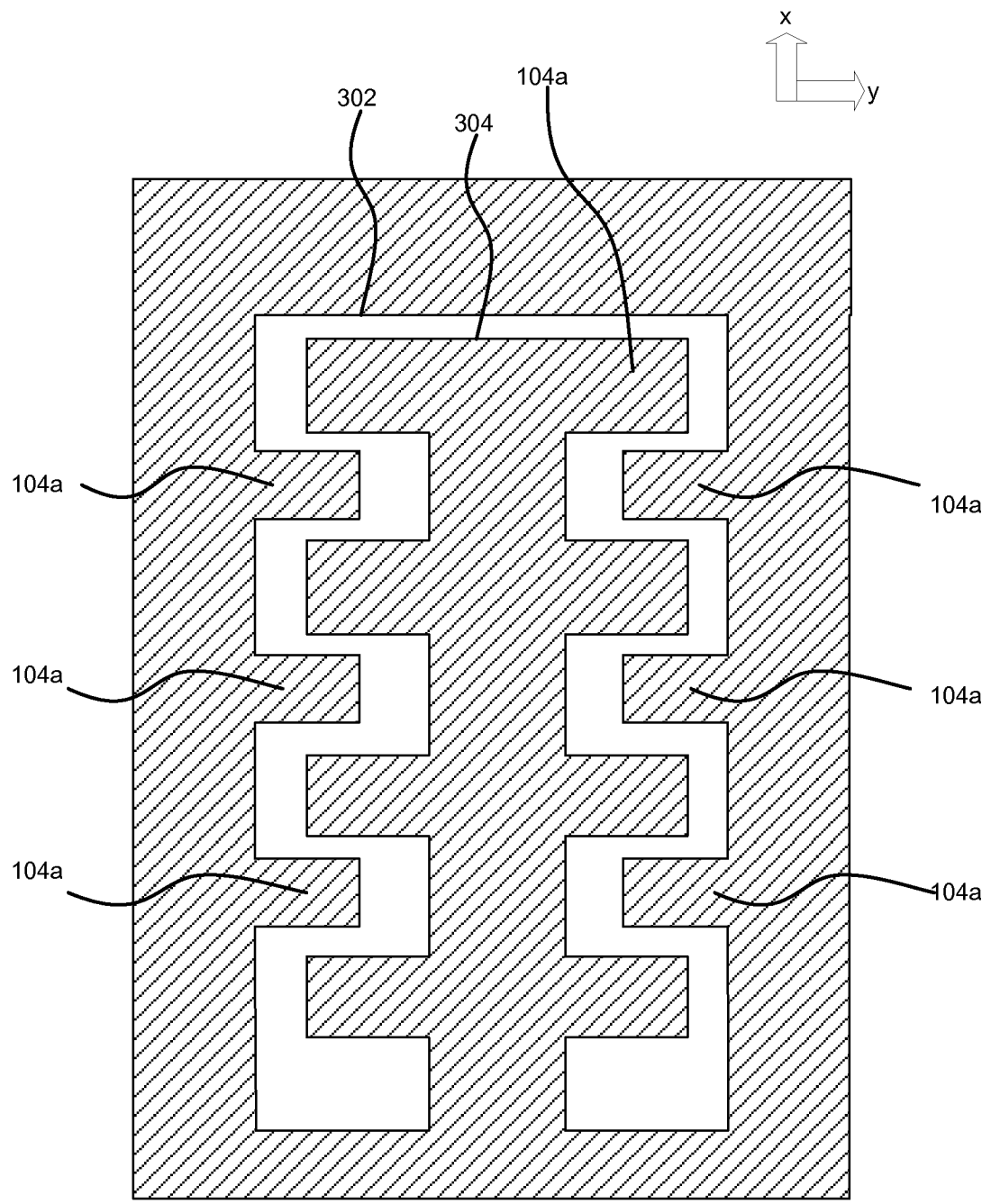
FIG. 4 shows a schematic top view according to an embodiment.

FIG. 4 shows a top view of an exemplary embodiment which may be obtained by applying the manufacturing process described above. FIG. 4 shows the top view of the cross-section of the plane shown as line A-A' in FIG. 3h. FIG. 4 shows the remaining parts 104a of the semiconductor structure which have not been subjected to the migration process due to the protection by the protection layer 106 and therefore remained after the migration process. The parts 104a form a MEMS device having a fixed element 302 and a flexible element 304. The flexible element 304 may for example form the flexible element of an acceleration or force sensor. The fixed element 302 and the flexible element 304 is elongate in horizontal directions extend in both horizontal directions (x- and y-direction). The flexible element 304 has a comb-like structure with a plurality of fingers which are interdigital arranged with a plurality of fingers of the fixed element 302. In operation, the plurality of fingers of the flexible element 304 moves horizontally with respect to the fingers of the fixed element 302 and is therefore capable to provide acceleration measurement signals or other measurement signals by detecting a capacity change or other physical changes. In order to detect the deflection, the flexible element 304 may be electrically isolated from the fixed element 302 for example by forming p-n junctions.

It is to be noted that the embodiment shown in FIG. 4 is only of exemplary nature in order to show an example of a device which can be produced by the process described above. In particular, many modifications including additional process steps such as additional etching, depositing and providing of additional structures, layers, sacrificial layers etc. may be provided to each of the embodiments described above.

In the above description, embodiments have been shown and described herein enabling those skilled in the art in sufficient detail to practice the teachings disclosed herein. Other embodiments may be utilized and derived there from, such that structural and logical substitutions and changes may be made without departing from the scope of this disclosure.

This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that specific terms used in the description and claims may be interpreted in a broad sense. The terms "coupled" or "connected" may be interpreted in a broad sense not only covering direct but also indirect coupling or connection.

It is further to be noted that embodiments described in combination with specific entities may in addition to an implementation in these entity also include one or more implementations in one or more sub-entities or sub-divisions of said entity.

The accompanying drawings that form a part hereof show by way of illustration, and not of limitation, specific embodiments in which the subject matter may be practiced.

In the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended.

It is further to be noted that methods disclosed in the specification or in the claims may be implemented by a device having means for performing each of the respective steps of these methods.

What is claimed is:

1. A device comprising:
   a semiconductor substrate of bulk material;
   a flexible element, the flexible element being formed from bulk material of the semiconductor substrate;
   a continuous layer comprising bulk material above the flexible element, wherein the continuous layer comprises recrystallized bulk material formed by a migration process; and
   a continuous material-free space between the semiconductor substrate and the continuous layer comprising bulk material.

2. The device according to claim 1, further comprising a layer of a material different than the bulk material, the layer of a material different than the bulk material being formed on the flexible element.

3. The device according to claim 2, wherein the layer of a material different than the bulk material comprises oxide, nitride, or high-K material.

4. The device according to claim 1, further comprising a further space which is free of material, wherein the flexible element is arranged in a vertical direction, with respect to a bottom surface of the substrate, between the continuous material-free space and the further space free of material.

5. The device according to claim 1, wherein the flexible element is arranged in a vertical direction, with respect to a bottom surface of the substrate, between a first main surface of the bulk semiconductor substrate and an opposing second main surface of the bulk semiconductor substrate.

6. The device according to claim 1, wherein the continuous layer comprising bulk material provides a cover for the flexible element.

7. The device according to claim 1, wherein the semiconductor substrate further comprises CMOS circuit elements.

8. The device according to claim 1, wherein the device is a MEMS device.

9. The device according to claim 8, wherein the device is an acceleration sensor or a force sensor.

10. The device according to claim 1, wherein the flexible element comprises a comb-like structure.

11. The device according to claim 1, wherein the device is configured to provide a capacitive measurement to measure a deflection of the flexible element.

12. The device according to claim 1, wherein the flexible element is electrically isolated against the semiconductor substrate.

13. The device according to claim 12, wherein the flexible element is electrically isolated against the semiconductor substrate by a p-n junction.

14. The device according to claim 1, wherein the flexible element is elongated in the semiconductor substrate.

15. The device according to claim 1, wherein the device is an Application Specific Integrated Circuit (ASIC).

* * * * *